United States Patent
Yamashita

(10) Patent No.: US 12,310,009 B2
(45) Date of Patent: May 20, 2025

(54) READ-ONLY MEMORY WITH VERTICAL TRANSISTORS

(71) Applicant: International Business Machines Corporation, Armonk, NY (US)

(72) Inventor: Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 210 days.

(21) Appl. No.: 18/054,835

(22) Filed: Nov. 11, 2022

(65) Prior Publication Data

US 2023/0076056 A1    Mar. 9, 2023

Related U.S. Application Data

(62) Division of application No. 17/064,285, filed on Oct. 6, 2020, now Pat. No. 11,545,499.

(51) Int. Cl.
| | |
|---|---|
| *H10B 20/00* | (2023.01) |
| *G11C 17/12* | (2006.01) |
| *H10B 20/25* | (2023.01) |
| *H10D 30/01* | (2025.01) |
| *H10D 64/01* | (2025.01) |

(52) U.S. Cl.
CPC ............ *H10B 20/38* (2023.02); *G11C 17/12* (2013.01); *H10B 20/25* (2023.02); *H10D 30/025* (2025.01); *H10D 64/021* (2025.01)

(58) Field of Classification Search
None
See application file for complete search history.

(56) References Cited

U.S. PATENT DOCUMENTS

| | | | |
|---|---|---|---|
| 4,442,507 A | | 4/1984 | Roesner |
| 5,095,362 A | * | 3/1992 | Roesner ............. H01L 23/5252 |
| | | | 257/334 |
| 6,166,943 A | | 12/2000 | Wang et al. |
| 6,828,197 B1 | | 12/2004 | Lai |
| 7,465,951 B2 | | 12/2008 | Scheuerlein |
| 8,350,308 B2 | | 1/2013 | Humbert et al. |
| 8,815,652 B2 | | 8/2014 | Inoue et al. |
| 9,443,910 B1 | | 9/2016 | Fujiwara et al. |
| 9,697,908 B1 | | 7/2017 | Rathi et al. |
| 10,062,702 B2 | | 8/2018 | Zhang et al. |

(Continued)

FOREIGN PATENT DOCUMENTS

| | | |
|---|---|---|
| EP | 0482880 B1 | 5/1996 |
| EP | 0845811 A3 | 6/1998 |
| WO | 2022073719 A1 | 4/2022 |

OTHER PUBLICATIONS

International search report and written opinion, International Application No. PCT/EP2021/075002, Dec. 22, 2021, 11 pgs.

(Continued)

*Primary Examiner* — Nilufa Rahim
(74) *Attorney, Agent, or Firm* — Matthew Zehrer

(57) ABSTRACT

Provided is a read-only memory (ROM) device. The ROM device comprises a substrate that has a plurality of vertical transport field effect transistors (VFETs). The ROM device further comprises an un-activated semiconductor layer provided on each VFET. The un-activated semiconductor layer includes implanted dopants that have not been substantially activated.

8 Claims, 8 Drawing Sheets

(56) References Cited

U.S. PATENT DOCUMENTS

| | | |
|---|---|---|
| 11,183,502 B1* | 11/2021 | Chiu ................... G11C 17/16 |
| 2010/0219469 A1 | 9/2010 | Min et al. |
| 2010/0244186 A1* | 9/2010 | Katsumata ............ H10B 20/00 |
| | | 365/96 |
| 2015/0380547 A1 | 12/2015 | Liaw |
| 2018/0061845 A1 | 3/2018 | Cheng et al. |
| 2019/0198571 A1 | 6/2019 | Xu et al. |
| 2019/0252609 A1 | 8/2019 | Sei et al. |
| 2020/0051990 A1 | 2/2020 | Harari et al. |
| 2021/0005250 A1* | 1/2021 | Tortorelli ........... G11C 13/0069 |
| 2022/0108996 A1 | 4/2022 | Yamashita |

OTHER PUBLICATIONS

List of IBM Patents or Patent Applications Treated as Related, [date signed], 2 pgs.
Masuhara, T., "Studies on Low Voltage-Low Power MOS Devices for Digital Integrated Circuits," Dissertation, https://doi.org.10/.14989/doctor.r3392, https://repository.kulib.kyoto-u.ac.jp/dspace/bitstream/2433/162242/2/D_Masuhara_Toshiaki.pdf, Kyoto University, Jul. 23, 29177, 168 pgs.

* cited by examiner

READ-ONLY MEMORY WITH VERTICAL TRANSISTORS

BACKGROUND

The present disclosure relates to the electrical, electronic, and computer fields. In particular, the present disclosure relates to read-only memory (ROM) cells with vertical transistors and methods of manufacturing the same.

Read-only memory (ROM) is a type of non-volatile memory used in computers and other electronic devices to store data that is not intended to be frequently changed. For example, ROM is useful for storing software that is rarely changed during the life of the system, also known as firmware. ROM may be hard-wired, such as diode matrix or mask ROM, or erasable and re-programmable, such as erasable programmable read-only memory (EPROM) or electrically erasable programmable read-only memory (EEPROM).

SUMMARY

Embodiments of the present disclosure include a method of fabricating a read-only memory (ROM) device. The method comprises forming a vertical transistor. A semiconductor layer is formed on the vertical transistor. Dopants are implanted in the semiconductor layer, where the implanted dopants are not substantially activated.

Additional embodiments of the present disclosure include a ROM device. The ROM device comprises a substrate that has a plurality of vertical transport field effect transistors (VFETs). The ROM device further comprises an un-activated semiconductor layer provided on each VFET. The un-activated semiconductor layer includes implanted dopants that have not been substantially activated.

Additional embodiments of the present disclosure include a method, system, and computer program product for programming a ROM device. The method comprises determining a value to be programmed into each ROM cell in a ROM device. An activation voltage is applied to one or more ROM cells to activate chemical dopants implanted in the one or more ROM cells. Activation of the chemical dopants changes a resistance of the ROM cell.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
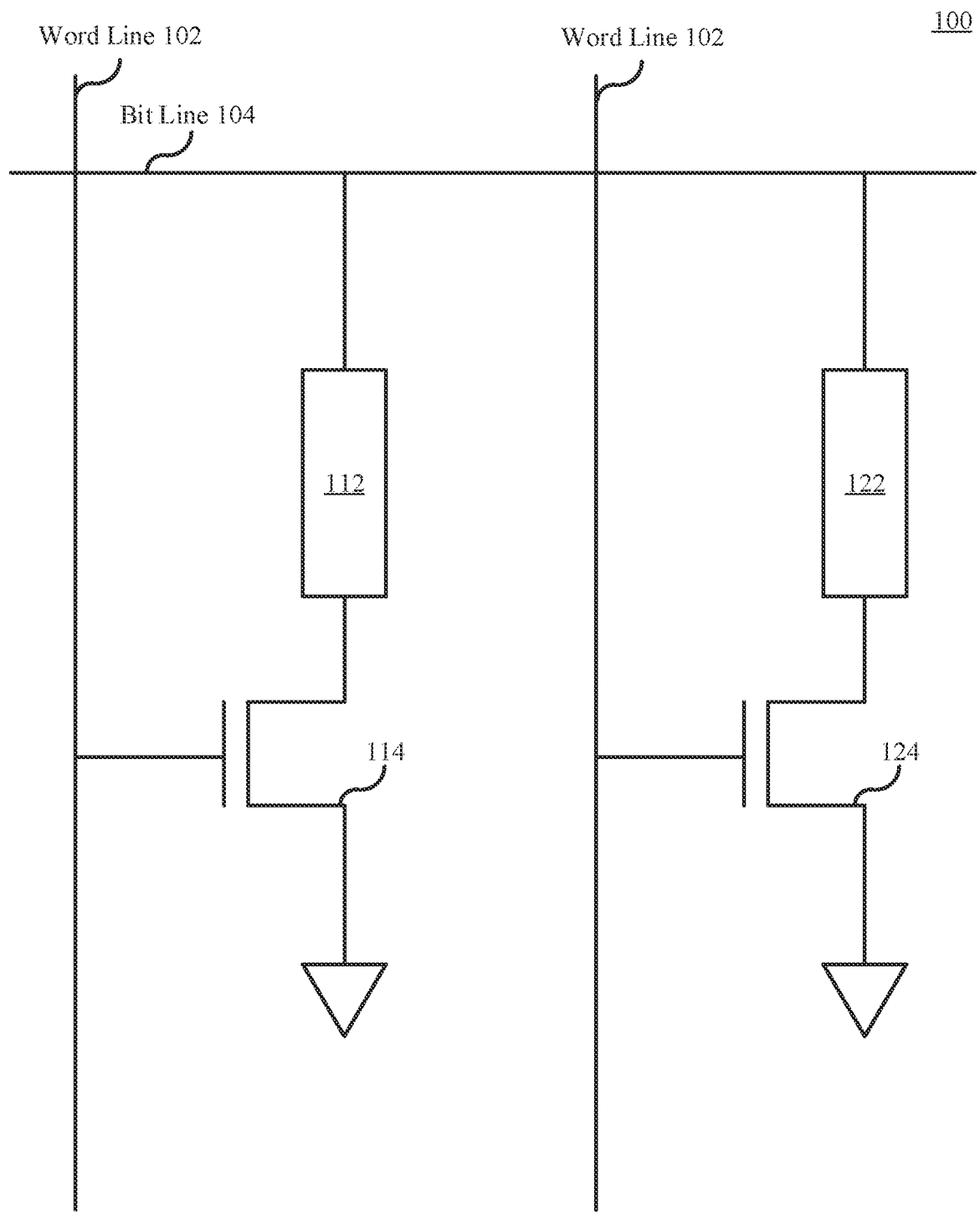
FIG. 1 is a block diagram of a portion of an example memory array, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the electrical, electronic, and computer fields, and in particular to read-only memory (ROM) cells with vertical transistors and methods of manufacturing the same. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, in general, a vertical transistor refers to a vertical transport field effect transistor (VFET) having, for example, a vertically oriented (i.e., away from the substrate) fin, or a nanowire or nanosheet transistor (e.g., a vertical nanowire transistor, such as a junctionless nanowire transistor), with a bottom source/drain disposed below the fin or nanowire (e.g., between the fin and the substrate) and a top source/drain disposed on the top of the fin or nanowire (opposite the bottom source/drain). VFETs are commonly used in high performance applications in complementary metal-oxide-semiconductor (CMOS) technology. Metal gates for the VFET may be disposed on the sides of the fin or nanowire, with a thin insulating dielectric material sitting between the gate and the fin or nanowire. The thin insulating dielectric layer is typically made from silicon oxide, silicon nitride, or high K dielectric materials, such as $Al_2O_3$, $HfO_2$, $ZrO_2$ or a combination of these, deposited by chemical vapor deposition (CVD), for example.

A ROM cell refers to any material or combination of materials capable of storing a single value (e.g., one bit of information) that can be read. In particular, embodiments of the present disclosure utilize resistive storage elements or memory cells. ROM cell values, which can be binary ('1' or '0') or analog (e.g., 0.65), are stored in the memory cells as a function of the cell's electrical resistance, similar to how values are stored in resistive random-access memory (ReRAM or RRAM) cells and/or memristors.

ROM is an integral part of most modern computer systems, and it is often used to store information that does not frequently change. For example, ROM is often used to store information such as firmware for electronic devices or microcode for microprocessors. Some types of ROM can only be programmed once, while other types of ROM is reprogrammable. For example, one of the most common types of ROM is mask ROM. Mask ROM utilizes integrated circuits that are fabricated by the integrated circuit manufacturer to store the value of the ROM cells using a plurality of transistors to physically encode the data into the integrated circuit. As such, mask ROM can only be programmed once. Other types of ROM, such as erasable programmable read-only memory (EPROM) or electrically erasable programmable read-only memory (EEPROM), can be reprogrammed, though doing so is often a slow process.

One of the drawbacks of current ROM manufacturing techniques is that ROM typically includes a large cell size, thereby requiring large areas of a silicon chip to store information. This large cell size limits the amount of ROM than designers can place on a silicon chip, where real estate is often a limited, and valuable, commodity. Embodiments of the present disclosure include a programmable ROM device that integrates a resistive element with a vertical transistor and a method of programming the ROM device by applying electrical pulses to generate heat and activate implanted dopants in the ROM cells. By utilizing a vertical transistor with a programmable resistive device stacked on top, the die size of ROM cells can be decreased relative to current designs, allowing chip designers to place more ROM cells in a given area.

Embodiments of the present disclosure include ROM cells that comprise a programmable resistive element disposed on top of a vertical transistor. CMOS compatible processes may be used to insert the resistive element in front end of line (FEOL) or back end of line (BEOL) modules. The resistive element may be an undoped or low-doped semiconductor grown on top of the fin or nanowire of the vertical transistor. The undoped or low-doped semiconductor contains dopants have been implanted, but not heavily (substantially) activated (e.g., such that the resistance is still high or above a threshold and/or the amount/percentage of dopants activated is below a threshold). For example, the resistive element may be Ge or SiGe in which B has been implanted. During implantation of the Boron (or other suitable dopant, such as Ga) particles, the temperature is controlled to ensure that the dopants are implanted without activation.

The undoped semiconductor will initially have a high resistance. In order to program the ROM array, voltage pulses will be selectively sent through individual ROM cells to generate heat in the undoped semiconductor. This heat will then activate the implanted dopants, causing the semiconductor to become a doped semiconductor, and thereby lowering the voltage. The applied voltage may have $V_{DD}$ height with a width of nanoseconds to seconds, depending on the materials used, the $V_{DD}$, and the desired resistance of the resistive element. The voltage may be applied after completion of the chip fabrication process.

Embodiments of the present disclosure may be used to generate a ROM array where each ROM cell has a binary value ('0' or '1'), as is common with ROM. In some embodiments, the ROM cells may be programmed to have multistate (e.g., ternary) or analog values. For example, the voltage applied to the ROM cells and the duty cycle may be controlled (e.g., using pulse-width modulation) to control the temperature of the undoped semiconductor and the amount of time that the temperature is maintained in order to control the amount of dopant that is activated. The more dopant that is activated, the lower the resistance of the resulting ROM cell will be. This may be particularly useful when applied to artificial intelligence fields. For example, embodiments of the present disclosure may be utilized to encode an artificial intelligence model directly into ROM.

Turning now to the figures, FIG. 1 illustrates a block diagram of a portion of an example memory array 100, in accordance with embodiments of the present disclosure. The illustrated portion of the example memory array 100 includes two word lines 102 and one bit line 104. The memory materials 112, 122 are coupled to the bit line 104. Additionally, each memory material 112, 122 is connected to a transistor 114, 124, and each transistor 114, 124 is connected to a word line 102. To read a ROM cell (e.g., the ROM cell comprising memory material 112 and transistor 114), a voltage high signal is driven into the gate of the transistor (e.g., transistor 114) using the word line 102. This causes the transistor 114 to become conductive, allowing current to flow through the memory material 112. The resistance of the memory material 112 can then be determined and converted into an appropriate value (e.g., a binary value '0' or '1'). Similarly, the ROM cell that comprises memory material 122 and transistor 124 can be read by driving the transistor 124 high, determining the resistance of the memory material 122, and converting the determined resistance into a value.

Figure 2:
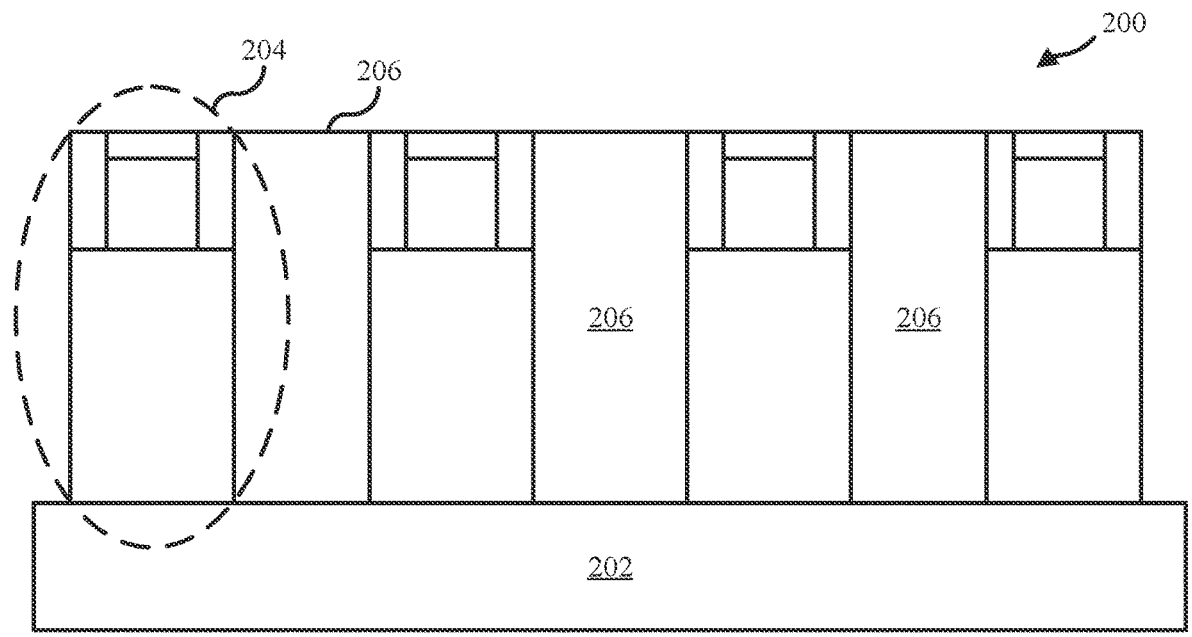
FIG. 2 is a cross-sectional view depicting a plurality of read-only memory (ROM) cells that comprise a resistive element disposed on top of a vertical transistor, in accordance with embodiments of the present disclosure.

Referring now to FIG. 2, shown is a cross-sectional view 200 depicting a plurality of ROM cells 204 that comprise a resistive element disposed on top of a vertical transistor (e.g., a VFET or a vertical nanowire or nanosheet transistor), in accordance with embodiments of the present disclosure. The ROM cells 204 may be fabricated on a substrate 202 using known CMOS fabrication techniques, as will be discussed in more detail with respect to FIGS. 4A-4G. The ROM cells 204 are separated from each other by an insulating material 206, such as a dielectric material.

Figure 3:
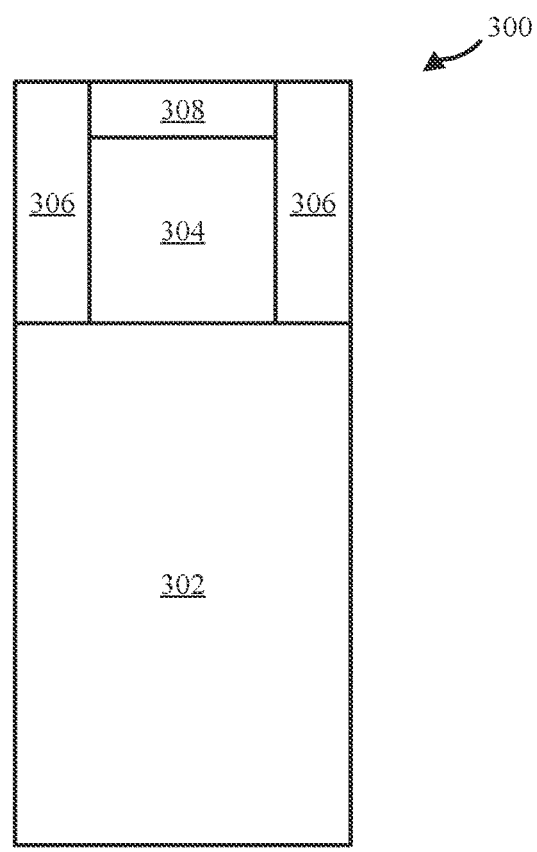
FIG. 3 is a cross-sectional view depicting major components of the ROM cell of FIG. 2, in accordance with embodiments of the present disclosure.

Referring now to FIG. 3, shown is a cross-sectional view depicting major components of a ROM cell 300, in accordance with embodiments of the present disclosure. The ROM cell 300 may be substantially similar to, or the same as, the ROM cells 204 of FIG. 2. The ROM cell 300 comprises a vertical transistor 302 (e.g., a vertical transport field effect transistor). The ROM cell 300 further comprises an undoped semiconductor layer 304 disposed on top of the vertical transistor 302.

Silicon dioxide ($SiO_2$) barriers 306 are disposed on either side of the undoped semiconductor layer 304. The SiO2 barriers 306 may help render the surface of the semiconductor 304 inert, preserve characteristics of p-n junctions, and prevent electrical characteristics of the vertical transistor 302 and/or undoped semiconductor 304 from deteriorating (e.g., through diffusion to the gaseous ambient environment). A metal contact pad 308 is disposed on top of the undoped semiconductor layer 304.

The ROM cell 300 includes additional sublayers and details not shown in FIG. 3. An example embodiment of these sublayers, as well as their fabrication steps, is shown in FIGS. 4A-4G.

Figure 4A:
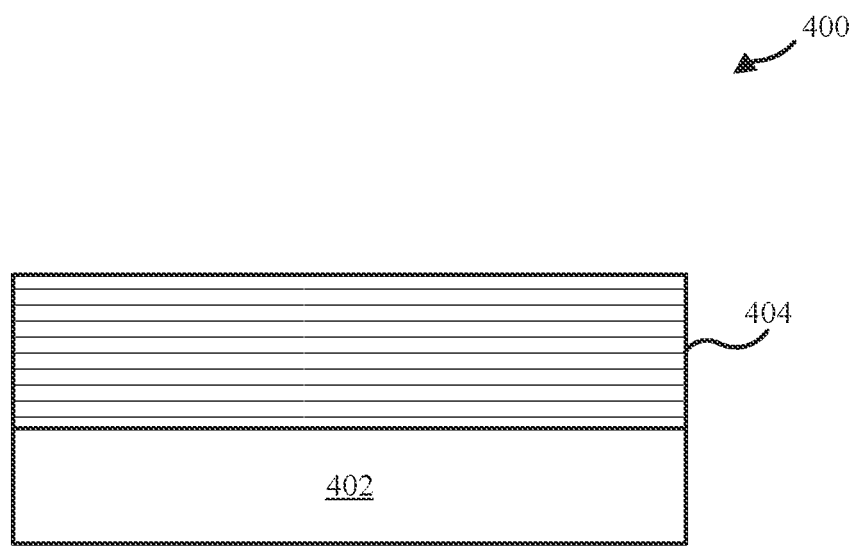
FIG. 4A is a cross-sectional view depicting a ROM cell device at an intermediate stage of the manufacturing process, according to embodiments.

Referring now to FIG. 4A, is a cross-sectional view depicting a ROM cell device 400 at an intermediate stage of the manufacturing process, according to embodiments. The ROM cell device 400 comprises a bottom source/drain 404 formed on top of a substrate 402. In some embodiments, the substrate 402 is an undoped silicon (Si) substrate such as a bulk Si wafer, or a silicon-on-insulator (SOI) wafer. In general, an SOI wafer includes an SOI layer separated from an underlying substrate by a buried insulator. When the buried insulator is an oxide it is often referred to as a buried oxide or BOX. It should be appreciated that the material of the substrate may be any suitable material or combination of materials known to one of skill in the art, and it may be a single layer or a plurality of sublayers.

In some embodiments, the bottom source/drain 404 is formed by ion implantation whereby a suitable n-type or p-type dopant is implanted into the substrate 402. Suitable n-type dopants include, but are not limited to, phosphorous (P) and arsenic (As). Suitable p-type dopants include, but are not limited to, boron (B).

Figure 4B:
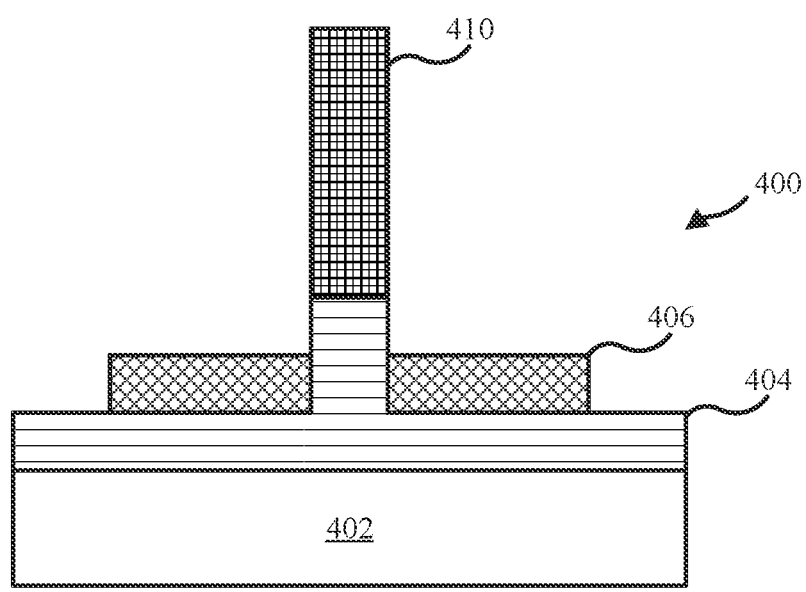
FIG. 4B is a cross-sectional view of a ROM cell device of FIG. 4A after additional fabrication operations, according to embodiments.

Referring now to FIG. 4B, portions of the bottom source/drain 404 are removed to create an extruding portion (illustrated in the center and referred to herein as the vertical fin channel 410 or simply vertical fin), and a bottom spacer 406 is formed on top of part of the bottom source/drain 404 and on either side of the vertical fin channel 410. As discussed in further detail below, the bottom spacer layer 406 offsets the bottom source/drain 404 from the gate electrode (that will be formed surrounding the vertical fin channel 410). According to some embodiments, the bottom spacer layer 406 is formed using a directional deposition process whereby a spacer material is deposited onto the bottom source/drain 404 and the vertical fin channels 410 with a greater amount of the material being deposited on the horizontal surfaces, as compared to the vertical surfaces. That is, a greater thickness of the material of the bottom spacer layer 406 will be deposited on top of the bottom source/drain 404 in between the vertical fin channels 410 than along the sidewalls of the vertical fin channels 410. Thus, when etching is later used to remove the relatively small amount of the spacer material on the sidewalls, the material of the bottom spacer layer 406 is removed from every vertical surface. However, since there is much more material on the horizontal surfaces, the etching can be stopped at an appropriate time after the material is removed from the vertical surfaces, leaving the bottom spacer layer 406 shown in FIG. 4B on top of the bottom source/drain 404. For example, a high-density plasma (HDP) chemical vapor deposition (CVD) or physical vapor deposition (PVD) process can be used for directional film deposition, and an isotropic etch can be used to remove the (thinner) spacer material deposited onto the vertical surfaces. Suitable materials for the bottom spacer 406 include, but are not limited to, oxide spacer materials such as silicon dioxide ($SiO_2$) and/or silicon carbon oxide (SiCO), and nitride spacer materials such as silicon nitride (SiN), silicon boron carbon nitride (SiBCN), silicon oxycarbon nitride (SiOCN), and/or silicon carbon nitride (SiCN).

In some embodiments, a fin liner layer (not shown) is formed on the vertical sidewalls of the vertical fin channels. In certain of these embodiments, the fin liner layer is formed of SiN and is formed through a combination of deposition and reactive ion etching (RIE). In general, RIE refers to an etching technology used in microfabrication. RIE is a type of dry etching which has different characteristics than wet etching. RIE uses chemically reactive plasma to remove material deposited on wafers. The plasma is generated under low pressure (vacuum) by an electromagnetic field. High-energy ions from the plasma attack the wafer surface and react with it. Like other dry plasma etch techniques, RIE has benefits such as etch rate, anisotropy, selectivity, uniformity, aspect ratio, and minimization of substrate damage. However, it should be appreciated that any suitable etching method or photolithography method known by one of skill in the art may be used to form the plurality of VFET devices.

Figure 4C:
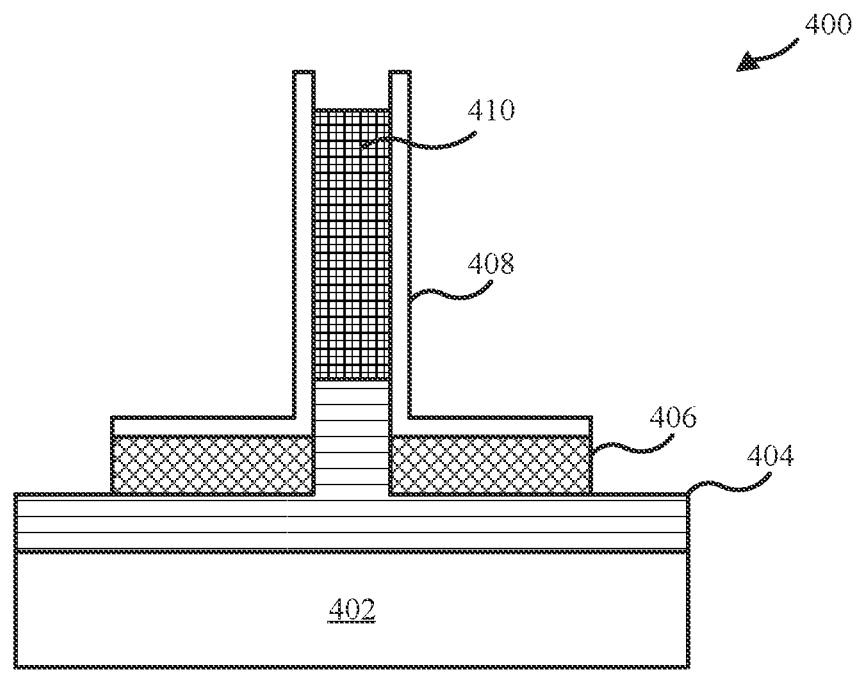
FIG. 4C is a cross-sectional view of a ROM cell device of FIG. 4B after additional fabrication operations, according to embodiments.

Referring now to FIG. 4C, following the formation of the bottom source/drain 404 and the bottom spacer 406, a gate stack (i.e., a gate electrode structure) is formed on the vertical fin. According to some embodiments, the gate stack includes a conformal gate dielectric layer 408 that is deposited onto the vertical fin. The conformal gate dielectric layer 408 comprises a high-κ gate dielectric material. In general, the term high-κ refers to a material with a high dielectric constant (κ, kappa), as compared to silicon dioxide. High-κ dielectrics are used in semiconductor manufacturing processes where they are usually used to replace a silicon dioxide gate dielectric or another dielectric layer of a device. Thus, the term high-κ as used herein refers to a material having a relative dielectric constant κ which is much higher than that of silicon dioxide (e.g., a dielectric constant κ=25 for hafnium oxide ($HfO_2$) rather than 4 for silicon dioxide). Examples of suitable high-κ gate dielectric materials include, but are not limited to, $HfO_2$ and/or lanthanum oxide ($La_2O_3$).

Figure 4D:
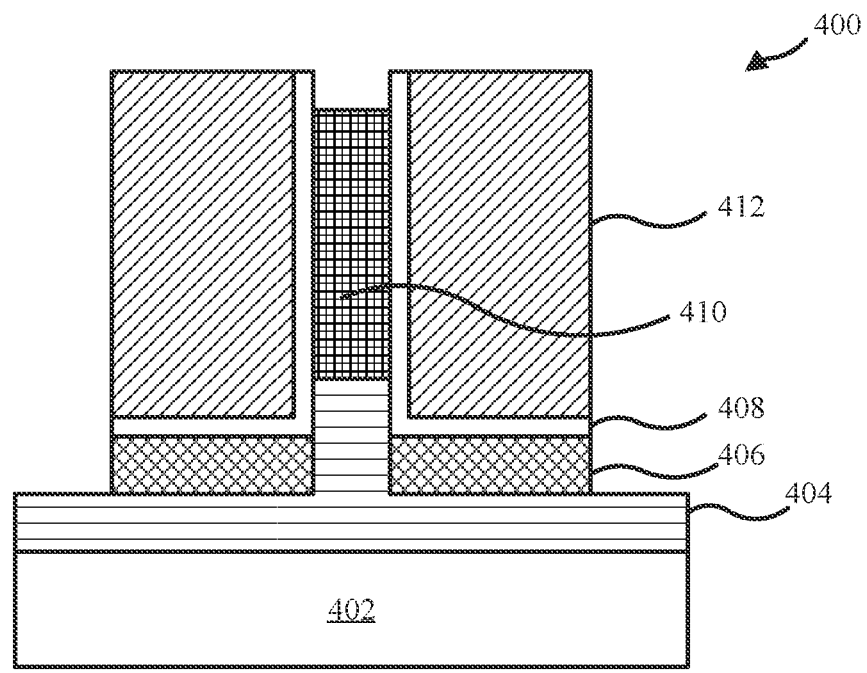
FIG. 4D is a cross-sectional view of a ROM cell device of FIG. 4C after additional fabrication operations, according to embodiments.

Referring now to FIG. 4D, a gate conductor layer 412 is formed by depositing a conductor on the gate dielectric layer 408. In certain embodiments, the conformal gate conductor layer 412 is a workfunction-setting metal (WFM). The particular workfunction-setting metal employed can vary depending on whether an n-type or p-type transistor is desired. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n-type and p-type workfunction metals given above.

Figure 4E:
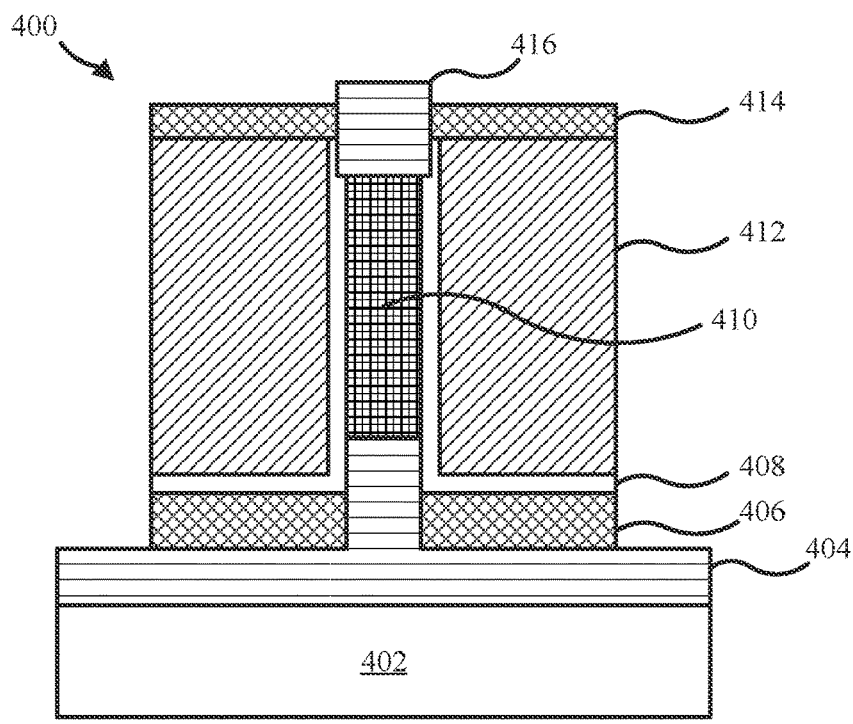
FIG. 4E is a cross-sectional view of a ROM cell device of FIG. 4D after additional fabrication operations, according to embodiments.

Referring now to FIG. 4E, a top spacer layer 414 is formed on top of the gate conductor layer 412 and on both sides of a top source/drain 416. The top spacer 414 may be formed in substantially the same way as the bottom spacer 406. After the top spacer layer 414 is deposited, it is etched back to a desired thickness. In an embodiment, the thickness of the top spacer layer 414 is set so that the top surface of the top spacer layer 414 is lower than the top surface of the top source/drain layer 416. The top source/drain layer 416 may be, for example, a layer of doped SiGe. The top source/drain layer 416 may be activated by an annealing process, as would be recognized by a person of ordinary skill in the art.

Figure 4F:
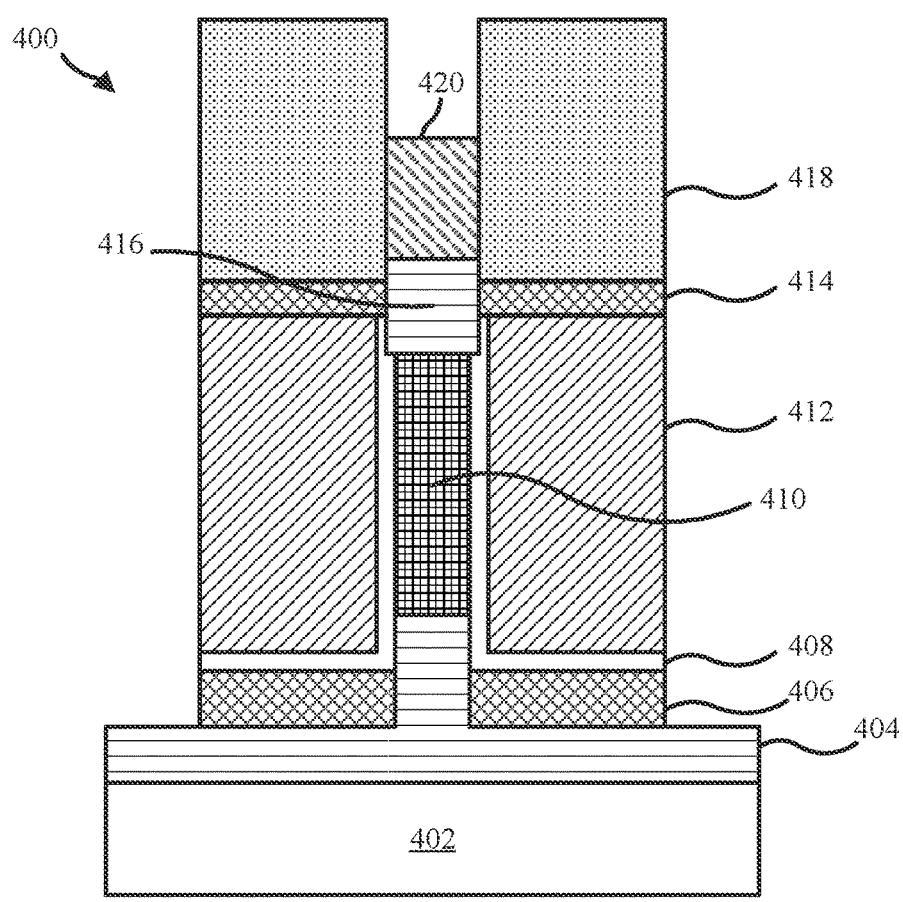
FIG. 4F is a cross-sectional view of a ROM cell device of FIG. 4E after additional fabrication operations, according to embodiments.

Referring now to FIG. 4F, silicon dioxide ($SiO_2$) 418 is formed on top of the top spacer layer 414. Additionally, an undoped semiconductor layer 420 is formed (e.g., grown) on top of the top source/drain layer 416. The undoped semiconductor layer 420 may be, for example, undoped Ge. After growing the undoped semiconductor layer 420, dopants may be implanted in the undoped semiconductor layer. For example, B or Ga may be implanted into the undoped semiconductor layer 420 using ion implantation processes. However, unlike the top source/drain layer 416, the undoped semiconductor layer 420 is not activated following implantation of the dopants. In other words, the temperature of the undoped semiconductor layer 420 is controlled such that the dopants are not activated during fabrication. The undoped semiconductor layer 420 acts to store the values of the ROM cell in the form of a programmable resistance.

Figure 4G:
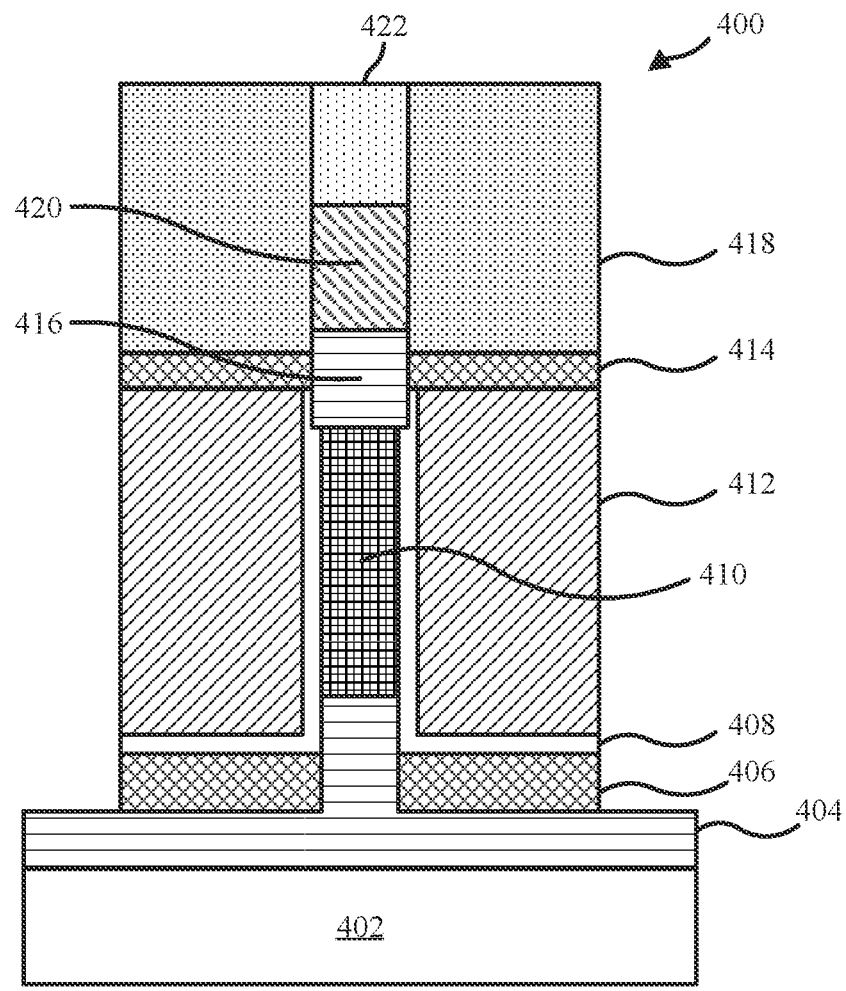
FIG. 4G is a cross-sectional view of a ROM cell device of FIG. 4F after additional fabrication operations, according to embodiments.

Referring now to FIG. 4G, a metal contact 422 is formed on top of the undoped semiconductor layer 420 and between caps in the $SiO_2$ layer 418. The metal contact 422 may be formed using any suitable metal and fabrication process, such as a metal deposition process.

It is to be understood that embodiments of the present disclosure may utilize a nanowire or nanosheet transistor instead of, or in addition to, a fin-based transistor (e.g., a VFET). As such, references to a fin (or fin channel) in FIGS. 4A-4G may be replaced with a nanowire, and the order or types of fabrication processes may be modified, as necessary, to include a nanowire or nanosheet transistor in the ROM cell, as would be apparent to those of ordinary skill in the arts.

Figure 5:
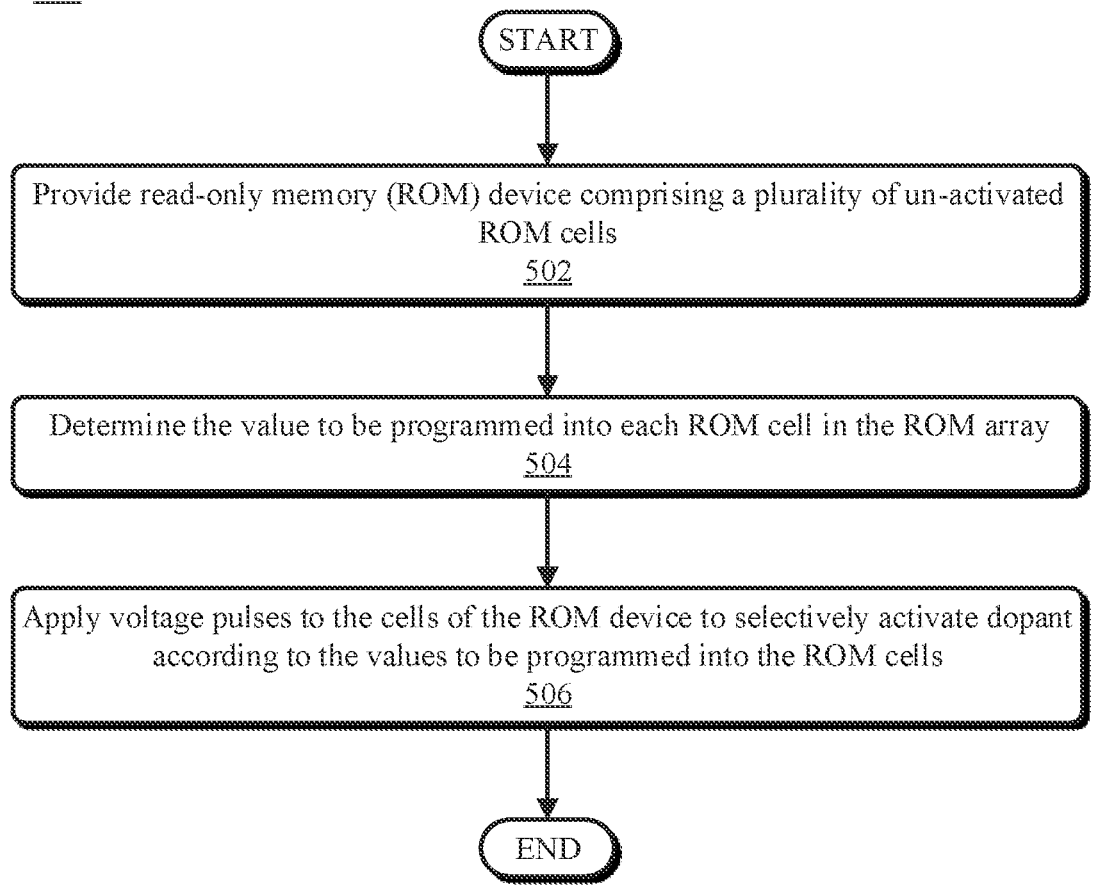
FIG. 5 illustrates a flowchart of an example method for programming a ROM array comprising a plurality of ROM cell devices, in accordance with embodiments of the present disclosure.

FIG. 5 illustrates a flowchart of an example method for programming a ROM array comprising a plurality of ROM cell devices, in accordance with embodiments of the present disclosure. The method 500 may be performed by hardware, firmware, software executing on a processor, or any combination thereof. The method begins at operation 502, wherein a ROM device is provided.

The ROM device may include an array of ROM cells, each of which having a programmable resistive element disposed on a vertical transistor. The ROM cells are initially in the un-activated state, meaning that the implanted dopants have not been activated by an annealing process. As such, each cell in the ROM device may be at an initial state (e.g., a high resistance state, which may correspond to a '1').

At operation 504, the value to be programmed into each ROM cell in the ROM array may be determined. The value for any given ROM cell may be binary ('0' or '1'), ternary ('0', '1', or '2'), analog, or any other suitable value. For example, the ROM cells may have a binary value if the ROM device is a replacement for typical ROM devices (e.g., to store system BIOS or firmware). However, if, for example, the ROM device is being programmed to store an artificial intelligence model, the ROM cells may store analog values (e.g., representing the weight between nodes in a neural network).

At operation 506, a voltage is applied to one or more cells of the ROM device to cause the ROM device to store the values determined at operation 504. The voltage applied to the one or more cells may be applied long enough for ROM cells to heat to an activation temperature (i.e., a temperature at which the implanted dopants are activated), thereby reducing the electrical resistance of the resistive element (e.g., the previously undoped semiconductor). Once sufficient activation of the ROM cell has occurred, the voltage may be removed. The resulting ROM cells will retain their electrical resistance characteristics, resulting in a non-volatile memory device.

For example, the ROM device may be programmed to store firmware as a set of binary bits encoded in the ROM cells. Accordingly, each ROM cell that is going to store a first bit value (e.g., '1') may not have an activation voltage applied to it. As such, the un-activated ROM cells may retain a high electrical resistance, which is associated with the bit value '1.' Meanwhile, each ROM cell that is going to store a second bit value (e.g., '0') will have an activation voltage applied to it. The activation voltage is applied long enough to ensure that the electrical resistance of the ROM cell drops to a value that can be easily distinguished from the un-activated ROM cells (e.g., a "low" resistance).

In some embodiments, analog values may be programmed into the ROM device by modulating the characteristics of the activation voltage according to an annealing plan. For example, the amount of voltage, duty cycle of the applied signal, and length of time that the activation voltage is applied can be regulated to control the amount of implanted dopant that is activated. In doing so, the resulting resistances of the ROM cells can be programmed to have values beyond just 0 and 1. This may be particularly useful in artificial intelligence applications because it allows more complex models, such as a convolutional neural network, to be programmed directly into ROM. For example, the weights between nodes can be programmed into ROM by converting the weights into associated resistance values, and selectively applying activation voltages to the ROM cells to encode the weights into them using the associated resistance values.

Figure 6:
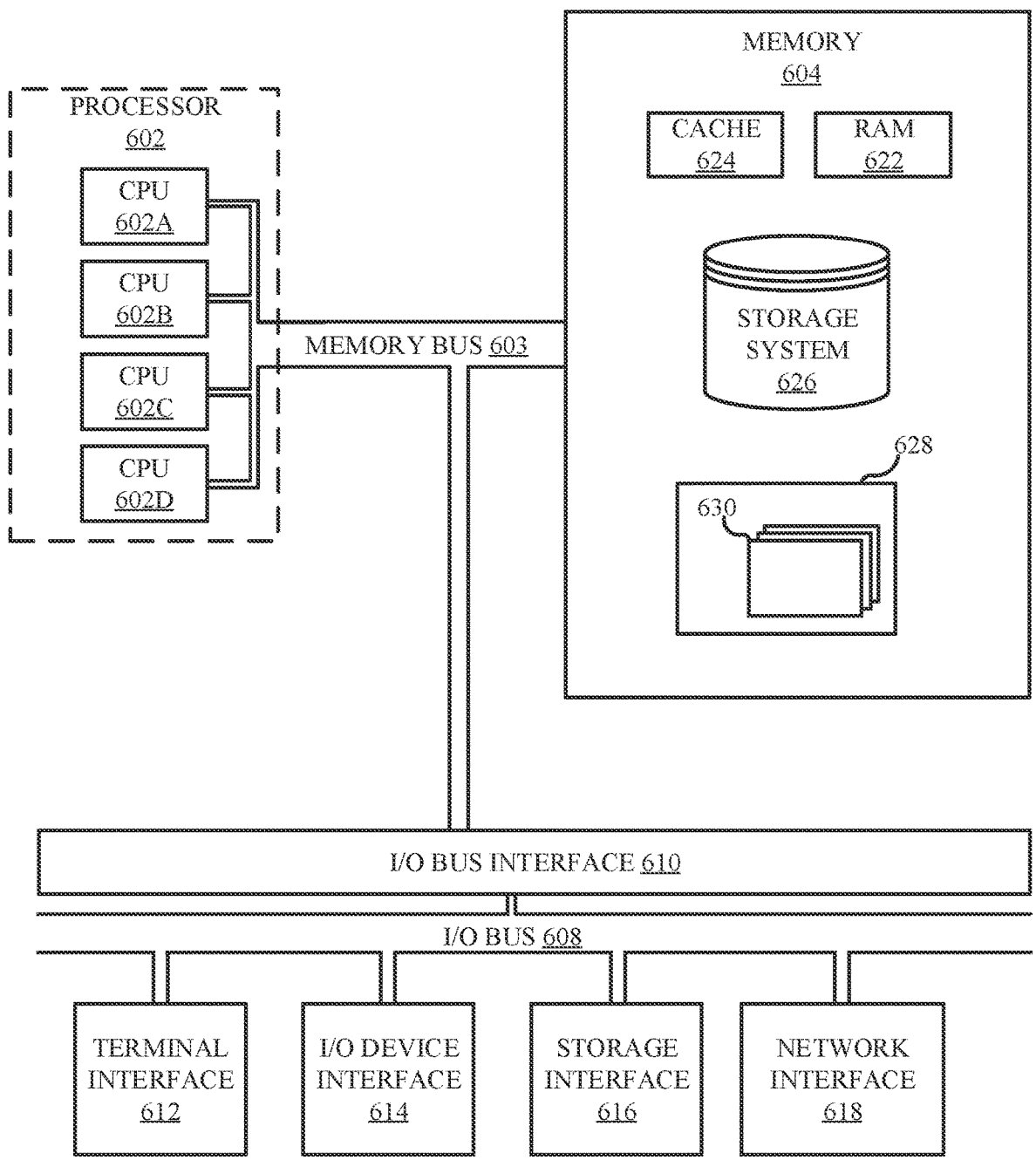
FIG. 6 illustrates a high-level block diagram of an example computer system that may be used in implementing one or more of the methods, tools, and modules, and any related functions, described herein, in accordance with embodiments of the present disclosure.

Referring now to FIG. 6, shown is a high-level block diagram of an example computer system 601 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 601 may comprise one or more CPUs 602, a memory subsystem 604, a terminal interface 612, a storage interface 616, an I/O (Input/Output) device interface 614, and a network interface 618, all of which may be communicatively coupled, directly or indirectly, for inter-component communication via a memory bus 603, an I/O bus 608, and an I/O bus interface unit 610.

The computer system 601 may contain one or more general-purpose programmable central processing units (CPUs) 602A, 602B, 602C, and 602D, herein generically referred to as the CPU 602. In some embodiments, the computer system 601 may contain multiple processors typical of a relatively large system; however, in other embodiments the computer system 601 may alternatively be a single CPU system. Each CPU 602 may execute instructions stored in the memory subsystem 604 and may include one or more levels of on-board cache.

System memory 604 may include computer system readable media in the form of volatile memory, such as random access memory (RAM) 622 or cache memory 624. Computer system 601 may further include other removable/non-removable, volatile/non-volatile computer system storage media. By way of example only, storage system 626 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 604 can include flash memory, e.g., a flash memory stick drive or a flash drive. Memory devices can be connected to memory bus 603 by one or more data media interfaces. The memory 604 may include at least one program product having a set (e.g., at least one) of program modules that are configured to carry out the functions of various embodiments.

One or more programs/utilities 628, each having at least one set of program modules 630 may be stored in memory 604. The programs/utilities 628 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Program modules 630 generally perform the functions or methodologies of various embodiments.

Although the memory bus 603 is shown in FIG. 6 as a single bus structure providing a direct communication path among the CPUs 602, the memory subsystem 604, and the I/O bus interface 610, the memory bus 603 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 610 and the I/O bus 608 are shown as single respective units, the computer system 601 may, in some embodiments, contain multiple I/O bus interface units 610, multiple I/O buses 608, or both. Further, while multiple I/O interface units are shown, which separate the I/O bus 608 from various communications paths running to the various I/O devices, in other embodiments some or all of the I/O devices may be connected directly to one or more system I/O buses.

In some embodiments, the computer system 601 may be a multi-user mainframe computer system, a single-user system, or a server computer or similar device that has little or no direct user interface, but receives requests from other computer systems (clients). Further, in some embodiments, the computer system 601 may be implemented as a desktop computer, portable computer, laptop or notebook computer, tablet computer, pocket computer, telephone, smart phone, network switches or routers, or any other appropriate type of electronic device.

It is noted that FIG. 6 is intended to depict the representative major components of an exemplary computer system 601. In some embodiments, however, individual components may have greater or lesser complexity than as represented in FIG. 6, components other than or in addition to those shown in FIG. 6 may be present, and the number, type, and configuration of such components may vary. Furthermore, the modules are listed and described illustratively according to an embodiment and are not meant to indicate necessity of a particular module or exclusivity of other potential modules (or functions/purposes as applied to a specific module).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications, alterations, and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s). Additionally, it is intended that the following claim(s) be interpreted as covering all such alterations and modifications as fall within the true spirit and scope of the invention.

What is claimed is:

1. A method of programming a ROM device, the method comprising:
    determining a value to be programmed into each of a plurality of ROM cells in a ROM device, wherein each ROM cell comprises a vertical transport field effect transistor (VFET), a respective un-activated semiconductor layer upon the VFET, a deterioration barrier upon sidewall(s) of the un-active semiconductor layer, and a conductive contact upon the deterioration barrier, wherein the un-activated semiconductor layer includes chemical dopants that have not been substantially activated; and
    applying an activation voltage to respective conductive contacts of a first set of one or more ROM cells to activate chemical dopants implanted in the respective un-activated semiconductor layers, wherein activation of the chemical dopants changes a resistance of the first set of one or more ROM cells to program the first set of one or more ROM cells to respectively store a first value, and wherein a second set of one or more ROM cells to which the activation voltage is not applied are programmed to store a second value.

2. The method of claim 1, wherein the ROM device is to be programmed to store analog values, and wherein the method further comprises:
   determining, for each ROM cell, a resistance associated with the value to be programmed into the ROM cell; and
   determining, for each ROM cell, an annealing plan that will activate an amount of dopants in the ROM cell such that the ROM cell will have the associated resistance.

3. The method of claim 1, wherein the ROM device comprises:
   a substrate; and
   an insulating material in direct contact with the substrate, in direct contact with neighboring ROM cells of the plurality of the ROM cells, and in direct contact with the respective deterioration barrier of the neighboring ROM cells.

4. A system for programming a ROM device, wherein the system comprises a processor configured to perform a method comprising:
   determining a value to be programmed into each of a plurality of ROM cells in a ROM device, wherein each ROM cell comprises a vertical transport field effect transistor (VFET), a respective un-activated semiconductor layer upon the VFET, a deterioration barrier upon sidewall(s) of the un-activated semiconductor layer, and a conductive contact upon the deterioration barrier, wherein the un-active semiconductor layer includes chemical dopants that have not been substantially activated; and
   applying an activation voltage to respective conductive contacts of a first set of one or more ROM cells to activate chemical dopants implanted in the respective un-activated semiconductor layers, wherein activation of the chemical dopants changes a resistance of the first set of one or more ROM cells to program the first set of one or more ROM cells to respectively store a first value, and wherein a second set of one or more ROM cells to which the activation voltage is not applied are programmed to store a second value.

5. The system of claim 4, wherein the ROM device is to be programmed to store analog values, and wherein the method further comprises:
   determining, for each ROM cell, a resistance associated with the value to be programmed into the ROM cell; and
   determining, for each ROM cell, an annealing plan that will activate an amount of dopants in the ROM cell such that the ROM cell will have the associated resistance.

6. The system of claim 4, wherein the ROM device comprises:
   a substrate; and
   an insulating material in direct contact with the substrate, in direct contact with neighboring ROM cells of the plurality of the ROM cells, and in direct contact with the respective deterioration barrier of the neighboring ROM cells.

7. A computer program product comprising one or more computer readable storage media having program instructions embodied therewith, the program instructions executable by a processor to perform a method comprising:
   determining a value to be programmed into each of a plurality of ROM cells in a ROM device, wherein each ROM cell comprises a vertical transport field effect transistor (VFET), a respective un-activated semiconductor layer upon the VFET, a deterioration barrier upon sidewall(s) of the un-activated semiconductor layer, and a conductive contact upon the deterioration barrier, wherein the un-active semiconductor layer includes chemical dopants that have not been substantially activated; and
   applying an activation voltage to respective conductive contacts of a first set of one or more ROM cells to activate chemical dopants implanted in the respective un-activated semiconductor layers, wherein activation of the chemical dopants changes a resistance of the first set of one or more ROM cells to program the first set of one or more ROM cells to respectively store a first value, and wherein a second set of one or more ROM cells to which the activation voltage is not applied are programmed to store a second value.

8. The computer program product of claim 7, wherein the ROM device comprises:
   a substrate; and
   an insulating material in direct contact with the substrate, in direct contact with neighboring ROM cells of the plurality of the ROM cells, and in direct contact with the respective deterioration barrier of the neighboring ROM cells.

* * * * *